US006204079B1

(12) United States Patent
Aspar et al.

(10) Patent No.: US 6,204,079 B1
(45) Date of Patent: Mar. 20, 2001

(54) SELECTIVE TRANSFER OF ELEMENTS FROM ONE SUPPORT TO ANOTHER SUPPORT

(75) Inventors: Bernard Aspar, Rives; Hubert Moriceau, Saint Egreve; Olivier Rayssac, Grenoble, all of (FR)

(73) Assignee: Commissariat A l'Energie Atomique, Paris (FR)

(*) Notice: Subject to any disclaimer, the term of this patent is extended or adjusted under 35 U.S.C. 154(b) by 0 days.

(21) Appl. No.: 09/352,783

(22) Filed: Jul. 14, 1999

(30) Foreign Application Priority Data

Jul. 30, 1998 (FR) .................................................. 98 09783

(51) Int. Cl.⁷ .................................................. H01L 21/00
(52) U.S. Cl. .............................. 438/25; 438/64; 438/67; 438/406; 438/458; 438/464
(58) Field of Search .................................. 438/406, 405, 438/401, 400, 403, 118, 412, 458, 977, 464, 460, 113, 125, 25, 64, 67; 257/623; 156/246, 250

(56) References Cited

U.S. PATENT DOCUMENTS

| | | | |
|---|---|---|---|
| 4,941,255 | 7/1990 | Bull | 29/833 |
| 5,244,818 | * 9/1993 | Jokerst et al. | 438/25 |

FOREIGN PATENT DOCUMENTS

| | | |
|---|---|---|
| 44 10 179 | 11/1995 | (DE) . |
| 0 029 334 | 5/1981 | (EP) . |
| 0 533 551 | 3/1993 | (EP) . |
| WO 94/17550 | 8/1994 | (WO) . |
| WO 94/17551 | 8/1994 | (WO) . |

OTHER PUBLICATIONS

W. P. Maszara, et al. Journal of Applied Physics, vol. 64, No. 10, Part 1, pp. 4943–4950, Bonding of Silicon Wafers for Silicon–On–Insulator, 1988.

Ylva Bäcklund, et al., J. Micromech, Microeng, pp. 158–160, "A Suggested Mechanism for Silicon Direct Bonding from Studying Hydrophilic and Hydrophobic Surfaces", 1992.

* cited by examiner

Primary Examiner—Charles Bowers
Assistant Examiner—Hsien-Ming Lee
(74) Attorney, Agent, or Firm—Oblon, Spivak, McClelland, Maier & Neustadt, P.C.

(57) ABSTRACT

A process for the selective transfer of elements from a transfer support to a reception support, the elements bonding through a first face to the transfer support according to a defined bonding energy, the elements each having a second face configured to contact with the reception support. Elements to be transferred are transferred by applying a bonding energy between them and the reception support that exceeds the bonding energy between their first face and the transfer support. Elements not to be transferred onto the transfer support are retained.

23 Claims, 3 Drawing Sheets

SELECTIVE TRANSFER OF ELEMENTS FROM ONE SUPPORT TO ANOTHER SUPPORT

BACKGROUND OF THE INVENTION

1. Title of the Invention

This invention relates to the selective transfer of elements from a transfer support to a reception support.

In particular, it relates to the transfer of partially or completely finished semiconductor chips from their initial substrate on which they were produced to a new substrate (or reception support) which may itself have been treated using microelectronic techniques.

The invention can be used for the transfer of chips, for example transfer of chips with a surface area of 1 cm$^2$ from their initial substrate onto glass or onto a transparent substrate. It can also be used to transfer optoelectronic components such as VCSEL (vertical cavity lasers) or small pieces of III–V semiconductor from their initial substrate onto silicon wafers prepared using microelectronic techniques in order to obtain III–V semiconductor elements on silicon. In this case, the size of chips is usually smaller, for example of the order of 1 mm$^2$ or less.

2. Description of the Related Art

The molecular bonding technique for bonding two surfaces made of semi-conductor material is known. Molecular bonding includes two types of bonding; namely hydrophilic bonding and hydrophobic bonding. In the case of hydrophilic bonding for the example of silicon oxide, bonding is the result of a change in —OH interactions at the surface of a structure to the formation of Si—O—Si bonds. The forces associated with this type of interaction are strong. The bonding energy is of the order of 100 mJ/m$^2$ at ambient temperature and reaches 500 mJ/m$^2$ after annealing at 400° C. for 30 minutes (values obtained for bonding between native or hydrophilic SiO$_2$ and unpolished thermal SiO$_2$). The bonding energy is usually determined by the blade method described by W. P. MASZARA et al. in the "Bonding of silicon wafers for silicon-on-insulator" article published in J. Appl. Phys. 64(10), Nov. 15, 1988, pages 4943–4950. The bonding energy for bonding between deposited, polished silicon oxide and deposited, polished silicon oxide, is of the order of 1 J/m$^2$ for annealing under the same conditions. However, if a hydrophilic treated surface is bonded by molecular bonding on a hydrophobic treated surface, very poor quality bonding is obtained and the bonding forces are very low; bonding energy of the order of 100 mJ/m$^2$ after annealing at 400° C. for 30 minutes.

Hydrophobic bonding is achieved by molecular bonding without an OH group. In the case of silicon, molecular bonding of hydrophobic wafers can also produce high bonding forces. For example, the work done by Y. BACKLUND et al. described in the "A suggested mechanism for silicon direct bonding from studying hydrophilic and hydrophobic surfaces" article published in J. Michromech. Microeng. 2 (1992), pages 158–160. This article shows that bonding forces of the order of 1 J/m$^2$ are obtained after annealing at 400° C., after bonding hydrophobic silicon wafers.

SUMMARY OF THE INVENTION

This invention was designed to obtain a selective transfer of elements from a first support to a reception support. In order to arrive at this result, it makes particular use of the molecular bonding technique.

Therefore, the purpose of this invention is a process for the selective transfer of elements from a transfer support to a reception support, the elements bonding through a first face to the transfer support with a defined bonding energy, each of the elements having a second face that may be put into contact with the reception support, the process comprising the following steps:

definition of at least one element to be transferred among the said elements, involving separation of the said element to be transferred from elements that are not to be transferred, treatment of the second face of the said element to be transferred to give it a bonding energy with the reception support exceeding the bonding energy between its first face and the transfer support, retaining means being provided to retain elements not to be transferred onto the transfer support, the second face of the element to be transferred is put into bonding contact with the reception support, separation of the transfer support from the reception support in order to transfer the element(s) to be transferred onto the reception support and to retain other elements on the transfer support.

The process may comprise the following preliminary steps:

formation of the elements on a face of an initial substrate, the elements being supported on the said face of the initial substrate through their second face, the face of the initial substrate comprising the elements is fixed to the transfer support such that the elements bond to it through their first face according to the said defined bonding energy, elimination of the initial substrate so that the second face of the elements is exposed.

In some cases, it may be useful to treat wafers in thin layers several times before transferring elements. It is thus possible to make double sided devices and to choose either face as being the contact face.

Preferably, bonding of the face of the initial substrate comprising the elements with the transfer support is obtained by molecular bonding. In this case, it is useful if this molecular bonding is made by one or several treatments of the faces to be bonded to the initial substrate and/or the transfer support so as to control the hydrophilia and/or hydrophobia properties and/or a satisfactory microroughness to obtain the defined bonding energy. Advantageously, a heat treatment may be applied globally or locally to contribute to obtaining this bonding energy. Elements may include a layer, called the stop layer, by which they are bonded to the initial substrate. This initial substrate may be eliminated by one or several techniques including grinding, chemical etching of the initial substrate and/or the stop layer, polishing, separation subsequent to heat treatment along a cleavage plane induced by ionic implantation.

If the elements form a continuous layer on the transfer support, the definition step of at least one element to be transferred may include isolation of the element to be transferred. Advantageously, this isolation may be produced by chemical etching, blade cutting, laser etching or any other cutting means. Preferably, when this isolation is made by etching, the cut is made in a manner such that etching stands are formed close to the transfer support.

The second face of the element to be transferred can be put into bonding contact with the reception support by molecular bonding. Heat treatment may be applied globally or locally to contribute to obtaining the defined bonding energy defined between the second face of the said element to be transferred and the reception support. Molecular bonding of the second face of the said element to be transferred and the reception support may be achieved by treatment of the second face and/or all or part of the reception support. Retaining means may consist of treating elements not to be transferred and/or areas of the reception support that are not suitable for receiving elements so that there is no bond between the elements that are not to be transferred and the reception support. They may consist of modifying the surface of the elements that are not to be transferred and/or the surface of the reception support areas that are not suitable for receiving the elements, in order to make the bonding energy between elements not to be transferred and the reception support less than the bonding energy between elements to be transferred and the reception support, and less than the bonding energy between the first faces of the elements and the transfer support. The treatment resulting in the said retaining means may be chosen from one or several of the following treatments—hydrophilia, hydrophobia, roughness, heat treatment, surface shrinkage.

If the second face of elements not to be transferred comes into contact with the reception support during the bonding contact step, the retaining means may consist of treating the second face of these elements not to be transferred to give it a hydrophobic bonding capacity with the reception support, the second face of the element to be transferred being treated to give it a hydrophilic bonding capacity, the reception support offering a hydrophilic bonding capacity to the second face of each element. They may also consist of treating the reception support area facing the second face of an element not to be transferred to give it a hydrophobic bonding capacity, the reception support area facing the second face of the element to be transferred being treated to give it a hydrophilic bonding capacity, all the second faces of the elements being treated to give them a hydrophilic bonding capacity. Obviously, the case of hydrophilic-hydrophilic bonding with a hydrophobic preparation of areas not to be transferred (at the elements and/or the reception support) is only one example, since the process may also be used in the case of a hydrophobic-hydrophobic bonding with hydrophilic treatment at the areas not to be transferred (at the elements and/or the reception support). Furthermore, the bonding forces may also be strongly modified and they may be made incompatible with a bonding contact by locally modifying the surface roughness.

In the case of molecular bonding, the heat treatments strongly modify the bonding forces. Therefore, this is an important parameter to be considered and it may be useful to carry out one or several heat treatments locally if it is required to have local control over bonding forces, in order to obtain the required bonding forces. Therefore, one variant of the process is to carry out the heat treatment locally so as to only heat the areas in which the transfer between elements and the reception support is to be made. Heating may also be applied using a laser or a heating tip. If all the second faces of the elements and the reception support are treated to give them the same type of bonding capacity, the retaining means may consist either of making local heat treatment, or preventing lack of mechanical contact between the second face of the elements not to be transferred and the reception support. For example, this lack of contact will be related to local shrinkage on the second face and/or on the reception support.

Advantageously, the transfer support and the reception support are separated by applying a mechanical force exerted between these supports and consisting of a tension and/or a shear force and/or a bending force, all of which may be assisted by heating.

The process according to the invention is applicable particularly to the case in which the elements comprise electronic components, for example semiconductor chips and/or passive elements. The elements mentioned are used for applications in microelectronics, optoelectronics, and even in the domain of supraconductors.

BRIEF DESCRIPTION OF THE DRAWINGS

The invention will be better understood and other advantages and special features will become obvious after reference to the following drawings.

DETAILED DESCRIPTION OF THE PREFERRED EMBODIMENTS

Figure 1:
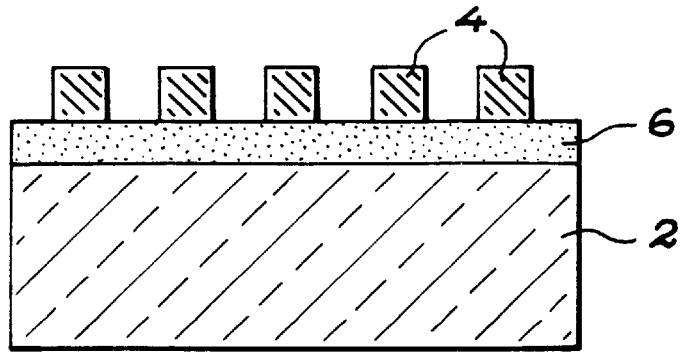
FIG. 1 is a cross-sectional view of a substrate with a stop layer and semiconductor chips.

FIG. 1 shows a substrate 2 called the initial substrate, for example made of silicon, on which semiconductor chips 4 were made using techniques known to an expert in the subject. A stop layer 6, for example made of silicon oxide, may be provided between the semiconductor chips 4 and the initial substrate 2. This stop layer has the advantage of better homogeneity of the transfer later since it forms a stop layer, for example with respect to chemical etching and/or etching by selective plasma.

Figure 2:
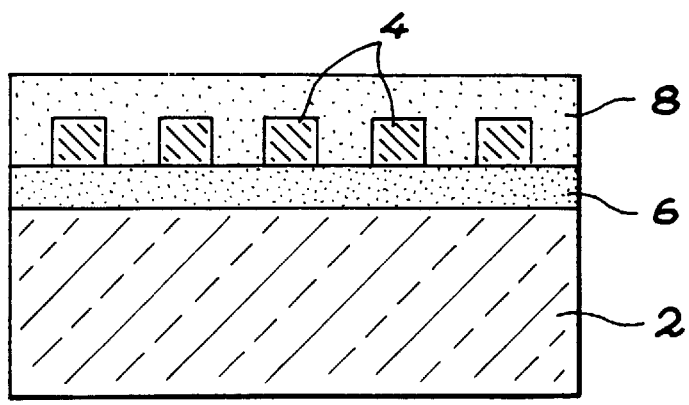
FIG. 2 is a cross-sectional view of the substrate of FIG. 1 including a surface preparation layer.

Semiconductor chips 4 are designed to be transferred selectively. In order to do this, the initial substrate surface on which the chips are made will be prepared to enable hydrophilic bonding with a controlled bonding energy. This surface preparation, illustrated in FIG. 2, may include the deposit of a layer 8 in which semiconductor chips 4 are embedded. The layer 8 may be a layer of silicon oxide on which a planarization operation has been carried out if the topology of its free surface makes it necessary.

The bonding energy of a surface may be controlled by modifying the roughness of this surface. For example, for molecular bonding of two $SiO_2$ oxide wafers together (unpolished thermal oxide in each case), an average rms roughness of the order of 6 angstroms obtained by HF etching will give a bonding energy of the order of 250 $mJ/m^2$ after annealing at a temperature of 400° C. for 30 minutes.

Figure 3:
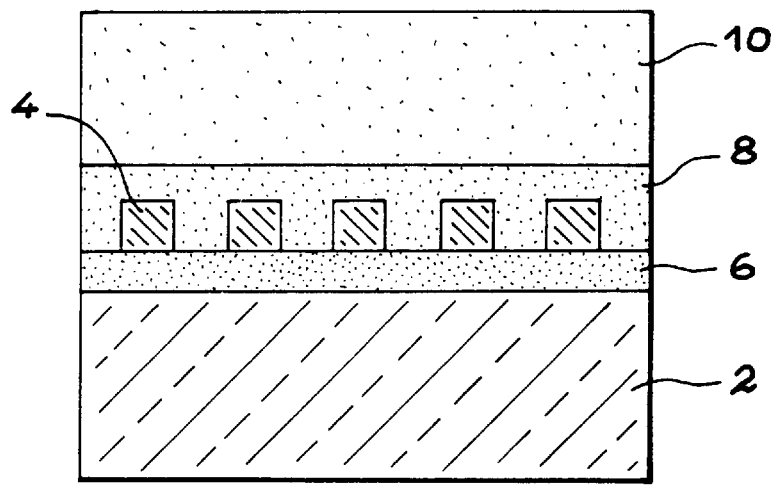
FIG. 3 is a cross-sectional view of the substrate of FIG. 2 including a transfer support.

As shown in FIG. 3, a transfer support or handle 10 is bonded onto the free face of layer 8. If the face of layer 8 bonded to the face of transfer support 10 each have a roughness of the order of 6 angstroms rms, the bonding energy obtained is of the order of 250 $mJ/m^2$. Some alignment problems may be eliminated if the handle 10 is transparent (for example made of glass or pure silica).

Figure 4:
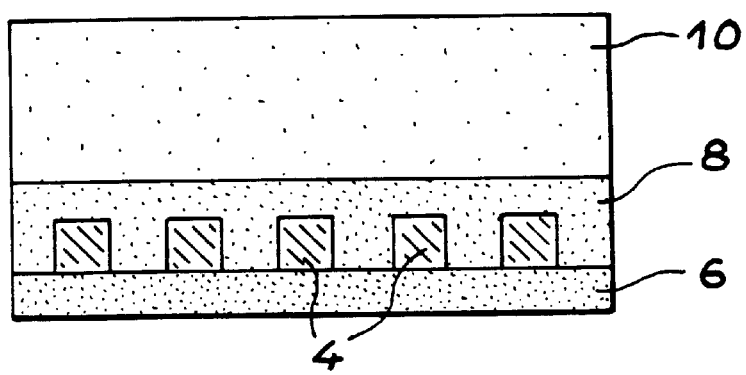
FIG. 4 is a cross-sectional view showing elimination of the initial substrate.

The initial substrate is then eliminated (see FIG. 4) using a conventional method or a combination of conventional methods, such as mechanical grinding, polishing or separation obtained following a heat treatment along a cleavage plane induced by ionic implantation. In particular, this final method is described in document FR-A-2 681 472. This embodiment may also be obtained by chemical, reactive, selective etching or by ultrasounds.

Figure 5:
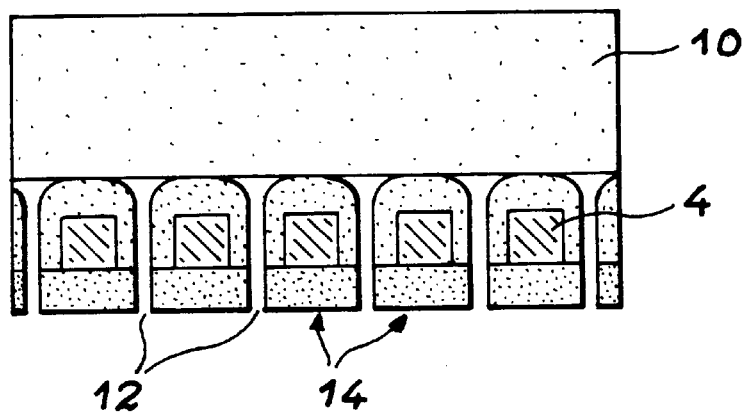
FIG. 5 is a cross-sectional view showing delimination grooves.

The elements to be transferred are then delimited. For example, this may be done by making delimitation grooves by chemical or dry etching, by a circular saw, a disk saw, or by ultrasound cutting. This is shown in FIG. 5, in which the grooves 12, cut as far as the transfer support 10, delimit elements 14, each element comprising a semiconductor chip 4.

There are several possible configurations for the grooves. It is useful to provide etching stands, as shown in FIG. 5, in order to initiate rupture afterwards. These etching stands may be obtained conventionally by dry etching and/or by chemical etching preferably at the bonding interface with the transfer support 10.

The free surface of the elements 14 is then prepared (for example surface cleaning and/or the deposition of a very thin oxide film) to give very good hydrophilic bonding. In some cases, it may be necessary to apply mechanical-chemical type polishing in order to obtain a micro-roughness compatible with molecular bonding. A hydrophilic preparation means any surface treatment that can produce OH groups on the surface.

The free surface of elements that are not to be transferred is treated to make it hydrophobic. Therefore, this treatment can delimit hydrophilic and hydrophobic areas. Areas may be made hydrophobic, for example using an HF treatment in the case of silicon oxide, by a plasma treatment or by any other local chemical treatment. It is also possible to use an object that can modify the hydrophilia when it is put into contact. For example, a Teflon® tip the same size as the surface to be treated could be used.

Figure 6:
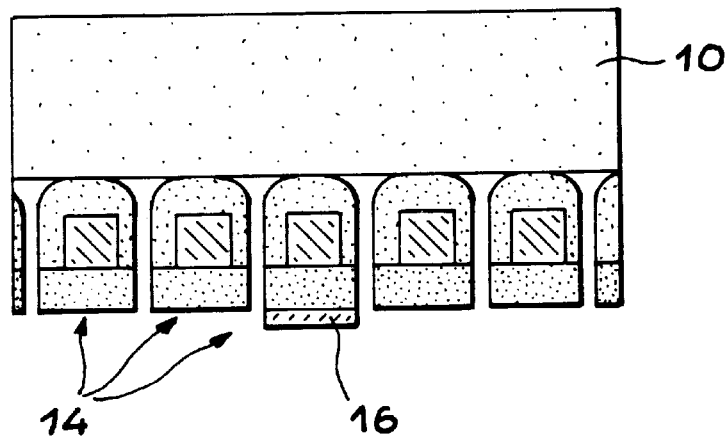
FIG. 6 is a cross-sectional view as in FIG. 5 showing delimited hydrophilic and hydrophobic areas.

FIG. 6 symbolically illustrates this type of treatment. One of the elements 14 is represented with a hydrophilic surface treatment 16, whereas the other elements 14 have hydrophobic surfaces.

Figure 7:
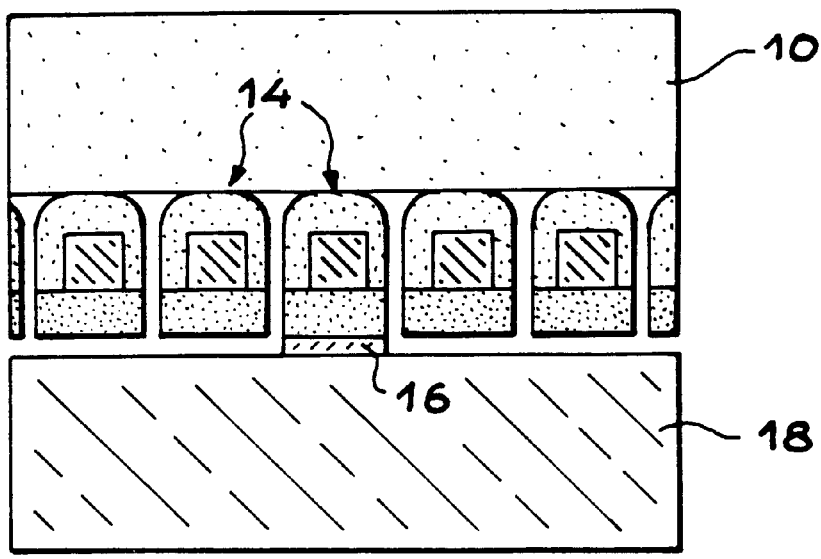
FIG. 7 is a cross-sectional view showing bonding of an element with a hydrophilic surface treatment.

Prepared in this way, the transfer support 10 provided with elements 14 may be bonded onto the reception support 18 which has been cleaned such that the surface presented by it to elements 14 is hydrophilic. In the structure shown in FIG. 7, the bonding energy between elements 14 and the transfer support 10 is of the order of 250 mJ/m$^2$. The bonding energy between element 14 with the hydrophilic surface treatment 16 and the reception support 18 exceeds 500 mJ/m$^2$. The bonding energy between the other elements 14 with a hydrophobic surface treatment and the hydrophilic surface of the reception support 18 is of the order of 100 mJ/m$^2$. Remember that bonding forces may be controlled by means of a heat treatment, for example at a temperature of 400° C. and for 30 minutes.

Figure 8:
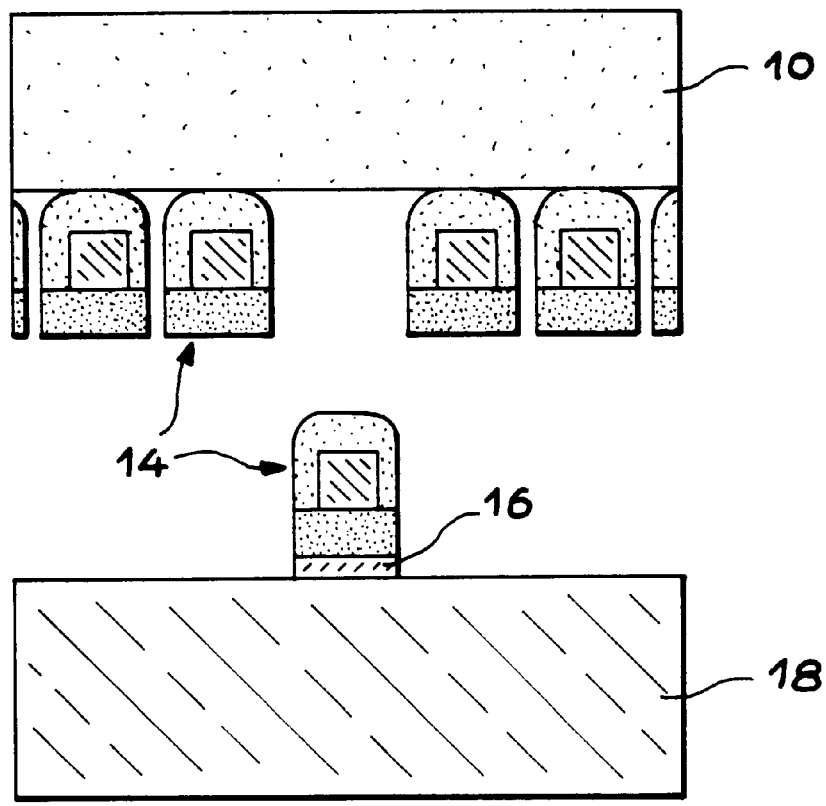
FIG. 8 is a cross-sectional view showing transfer of a hydrophilically treated element onto the hydrophilic surface of a reception support by bonding energies.

Starting from this structure, all that is necessary is to exert a mechanical force between the two supports 10 and 18 to transfer a hydrophilically treated element onto the hydrophilic surface of the reception support 18, due to control of bonding energies. Other elements which were treated hydrophobically remain on the transfer support 10. This is shown in FIG. 8.

The process according to the invention enables precise positioning of an element (including a semiconductor chip) on its new support by standard lithography means, or preferably by means of a transparent handle by optical alignment or by a micro-crystalline handle for alignment by X-rays. It enables the transfer of elements in several steps, or the transfer a several elements at the same time. It also enables the transfer of any type of solid material. The size of semiconductor chips that can be transferred in this way can vary from a few tens of square micrometers to several square centimeters.

The transfer of elements using the process according to the invention only occurs in areas in which bonding is effective by the contact of hydrophilic surfaces between elements and the reception support. This may be done using different variants. The surface of elements to be transferred may be made hydrophilic, and the corresponding surface of the reception support may also be made hydrophilic, while the surface of elements not to be transferred is made hydrophobic (case described above).

According to another variant, the surface of all elements is made hydrophilic, and the corresponding surface of the reception support facing the elements to be transferred is made hydrophilic, whereas areas of the reception support facing elements not to be transferred are made hydrophobic.

According to another variant, the surface of all elements, and the surface of the reception support, are made hydrophilic. Elements not to be transferred are set back. In this case, only the elements to be transferred come into contact with the reception support. For example, setting back may be achieved by chemical etching and/or dry etching, in the case of chemical etching with HF in the presence of SiO$_2$. Lithography may be achieved in order to delimit areas to be treated.

According to another variant, the surface of all elements and the surface of the reception support on which areas facing elements not to be transferred are set back, are made hydrophilic.

The process according to the invention is applicable to the individual transfer or collective transfer of elements from their initial support to their reception support. For example, if a substrate comprises 150 transferable semiconductor chips and it is only required to transfer 50 chips at one time onto the reception support, it is possible to start by transferring 50 chips by calculating the pitch between the chips, and then offsetting one of the supports by the defined pitch, transferring another 50 chips, making a new offset at the defined pitch, and then transferring the last 50 chips.

Another variant of the process consists of using chemical or physical treatments that make a large local difference to the roughness. For example, if the areas not to be bonded are roughened by chemical cleaning in order to produce rms roughnesses of the order of 15 angstroms, bond forces will be so low even after hydrophilic cleaning that the transfer will not take place in areas in which the roughness is high. This selective treatment may be applied to elements to be transferred or on the reception support.

What is claimed is:

1. A process for the selective transfer of elements from a transfer support to a reception support, said elements bonding at a first face to the transfer support with a defined bonding energy, each of said elements having a second face configured to contact said reception support, the process comprising the steps of:

defining at least one transferring element among said elements, involving separation of said transferring element from the non-transferring elements;

treating the second face of said transferring element by giving it a bonding energy with said reception support exceeding said bonding energy between its first face and said transfer support;

retaining said non-transferring elements onto said transfer support;

configuring said second face of said transferring element to contact with said reception support; and separating said transfer support from said reception support in order to transfer said transferring element onto said reception support and to retain other of said non-transferring elements on said transfer support.

2. A process according to claim 1, further comprising prior to the defining step the steps of:

forming said elements on a face of an initial substrate, said elements being supported on said face of said initial substrate by second face of said elements;

fixing said face of said initial substrate comprising said elements to said transfer support such that said elements bond to said transfer support through said first faces of said elements according to said defined bonding energy;

eliminating said initial substrate so that said second face of said elements exposes itself.

3. A process according to claim 2, wherein in said fixing step said face of said initial substrate comprising said elements fixes to said transfer support by molecular bonding.

4. A process according to claim 3, wherein said molecular bonding achieves at least one treatment of said faces fixing at least one of said initial substrate and said transfer support controlling at least one of hydrophilia, hydrophobia and micro-roughness capable of obtaining said defined bonding energy.

5. A process according to claim 4, wherein said hydrophilic surface is obtained by at least one of cleaning, roughness, and deposition.

6. A process according to claim 4, wherein said hydrophobic surface is obtained by at least one of cleaning and pollution by contact with tetrafluoroethylene.

7. A process according to claim 3, further comprising the step of applying a heat treatment globally or locally to contribute to obtaining said bonding energy defined between said face of said initial substrate comprising said elements and said transfer support.

8. A process according to claim 2, wherein in said forming step said elements include a stop layer configured to bond said elements to said initial substrate.

9. A process according to claim 2, wherein in said eliminating step said initial substrate is eliminated by at least one of grinding, chemical etching of at least one of said initial substrate and said stop layer, polishing, and separation subsequent to heat treatment along a plane of cleavage induced by ionic implantation.

10. A process according to claim 1, further comprising the steps of forming a continuous layer over said transfer support by said elements, and in the step of defining at least one transferring element isolating said transferring element.

11. A process according to claim 10, wherein said isolation is configured by at least one of chemical etching, cutting by blade, and laser etching.

12. A process according to claim 11, wherein when said isolation is configured by said chemical etching to form etching stands close to said transfer support.

13. A process according to claim 1, wherein said second face of said transferring element is configured to contact with said reception support by molecular bonding.

14. A process according to claim 13, further comprising the step of applying a heat treatment globally or locally to contribute to obtaining said bonding energy defined between said second face of said transferring element and said reception support.

15. A process according to claim 13, wherein said molecular bonding of said second face of said transferring element and said reception support is through treatment of at least one of said second face and at least a part of said reception support.

16. A process according to claim 1, wherein said retaining step comprises treating at least one of said non-transferring elements and areas on said reception support not suitable for receiving said elements such that there is no bond between said non-transferring elements and said reception support.

17. A process according to claim 16, wherein said retaining step comprises modifying at least one of said surface of said non-transferring elements and said surface of said reception support areas not suitable for receiving said elements configured to make said bonding energy between said non-transferring elements and said reception support less than said bonding energy between said transferring elements and said reception support, and less than said bonding energy between the first faces of the elements and said transfer support.

18. A process according to claim 16, wherein the treatment resulting in said retaining step is at least one of hydrophilia, hydrophobia, roughness, heat treatment, and surface shrinkage.

19. A process according to claim 16, wherein said second face of said non-transferring elements is configured for bonding contact with said reception support, and said retaining step comprises treating said second face of said non-transferring elements to give it a hydrophobic bonding capacity with said reception support, said second face of said transferring element being treated to give it a hydrophilic bonding capacity, said reception support offering a hydrophilic bonding capacity to said face of each element.

20. A process according to claim 16, wherein said second face of said non-transferring elements configured for bonding contact with said reception support, and said retaining step comprises treating the area of said reception support facing said second face of said non-transferring element to give it a hydrophobic bonding capacity, said area of said reception support facing said second face of said transferring element being treated to give it a hydrophilic bonding capacity, all second faces of said elements being treated to provide them with a hydrophilic bonding capacity.

21. A process according to claim 1, wherein said step of separating said transfer support from said reception support results from a mechanical force applied between these supports consisting of a tension force and/or a shear force and/or bending force.

22. A process according to claim 1, wherein said elements comprise electronic components.

23. A process according to claim 1, wherein said electronic components are semiconductor chips.

* * * * *